United States Patent [19]

Goela et al.

[11] Patent Number: 5,071,596
[45] Date of Patent: Dec. 10, 1991

[54] FABRICATION OF LIGHTWEIGHT CERAMIC MIRRORS BY MEANS OF A CHEMICAL VAPOR DEPOSITION PROCESS

[75] Inventors: Jitendra S. Goela, Andover; Raymond L. Taylor, Saugus, both of Mass.

[73] Assignee: CVD Incorporated, Woburn, Mass.

[21] Appl. No.: 425,638

[22] Filed: Oct. 23, 1989

[51] Int. Cl.⁵ .............................................. B29D 11/00
[52] U.S. Cl. ....................................... 264/1.2; 264/1.9; 264/81
[58] Field of Search ................... 264/1.2, 1.9, 81, 220; 427/163, 255; 350/320

[56] References Cited

U.S. PATENT DOCUMENTS

| | | | |
|---|---|---|---|
| 4,142,006 | 2/1979 | Choyke et al. | 427/162 |
| 4,378,626 | 4/1983 | Eitel | 29/527.2 |
| 4,444,467 | 4/1984 | Shuskus et al. | 350/310 |
| 4,814,232 | 3/1989 | Bluege et al. | 428/450 |

Primary Examiner—James Lowe
Assistant Examiner—Christopher A. Fiorilla
Attorney, Agent, or Firm—Gerald K. White

[57] ABSTRACT

A process to fabricate lightweigth ceramic mirrors, and in particular, silicon/silicon carbide mirrors, involves three chemical vapor deposition steps: one to produce the mirror faceplate, the second to form the lightweight backstructure which is deposited integral to the faceplate, and the third and final step which results in the deposition of a layer of optical grade material, for example, silicon, onto the front surface of the faceplate. The mirror figure and finish are fabricated into this latter material.

20 Claims, 2 Drawing Sheets

FABRICATION OF LIGHTWEIGHT CERAMIC MIRRORS BY MEANS OF A CHEMICAL VAPOR DEPOSITION PROCESS

This invention was made with Government support under Contract No. NAS1-18476 awarded by NASA. The Government has certain rights in this invention.

BACKGROUND OF THE INVENTION

1. Field of the Invention

This invention relates to a process for fabricating lightweight ceramic mirrors and, more particularly, to the fabrication of lightweight silicon/silicon carbide (Si/SiC) mirrors by means of a chemical vapor deposition process.

2. Description of the Prior Art

In the field of optics, light detection and ranging (LIDAR) has come to be recognized as an important diagnostic tool for remote measurement of a diversity of atmospheric parameters such as minor species concentrations, pressure, temperature, and water vapor profiles, aerosol cloud distributions, and wind fields. LIDAR techniques such as measurement of back scattered signals, differential absorption, and Doppler shifts have been used to obtain information about the earth's atmosphere.

The performance of a LIDAR system depends upon the optical configuration of its receiving telescope. Often, due to space limitations such as in a shuttle-borne LIDAR system, the length of the telescope is fixed. Therefore, the optical designer must select a particular shape and optics speed of the mirrors to maximize the throughput of the telescope. The most critical element of the receiving telescope is the primary mirror because of its size, weight, fabrication cost, and thermal exposure to the outside world. Since the received signal is directly proportional to the area of the primary mirror, it is important to use as large a primary mirror as feasible to obtain reasonable signal levels for accurate measurement. This is particularly true when a space-borne LIDAR system is used to measure wind profiles in the troposphere on a global basis.

The conventional techniques employed in the prior for fabricating large ($\geq 1.0$ meter diameter) mirrors are quite slow and time consuming. Several months to years are required to fabricate a large mirror from ultra low expansion silica glass or Zerodur, a product commercially available from Schott Glass Technologies, Inc., 400 York Avenue, Duryea, Penna. 18642. Since a number of space-based LIDAR systems are planned for the future, considerable attention is currently being given to the development of techniques for the rapid and economic production of large, high performance mirrors.

Thus, a spin casting technique has been proposed to fabricate 1.2 meter and 3, 5 meter diameter glass mirror blanks containing lightweight honeycomb cells. Although this technique is relatively faster than the conventional mirror fabrication methods and produces lightweight mirrors, the weight of these mirrors is still an order of magnitude more than permissible for many space applications. Further, the spin-casting technique is unsuitable for fabricating large mirrors of advanced ceramics such as SiC, titanium diboride ($TiB_2$), and boron carbide ($B_4C$) that have high melting points. These latter materials have properties superior to those of glass for large lightweight optics.

Other techniques involving the casting of fiber reinforced composites containing epoxy and plastics and the stretching of membranes over appropriate substrates are also currently under investigation.

Thus, there is a need and a demand for improvement in the methods of fabrication of high performance optics, in large and small sizes, rapidly, efficiently, and in a cost effective manner. Large, lightweight optical components, in particular, mirrors, are required for many space-based systems such as LIDAR systems, astronomical telescopes, solar collectors, high energy particle, ion and laser beam concentrators and deflectors. The present invention was devised to fill the technological gap that has existed in the art in these respects.

SUMMARY OF THE INVENTION

An object of the invention is to provide a chemical vapor deposition process for the rapid fabrication of lightweight ceramic mirrors.

Another object of the invention is to provide such a process for the fabrication of mirrors having a faceplate of either Si or Si-coated SiC and a lightweight backstructure made of either Si or SiC.

Another object of the invention is to provide a process to fabricate a lightweight ceramic mirror comprising the steps of:
  (a) forming on a mandrel a surface that is a negative of the actual figure that is desired for the mirror being fabricated and chemically vapor depositing a layer of ceramic material on such surface thereby to form a faceplate for the mirror;
  (b) forming and bonding a lightweight backstructure to the exposed surface of the faceplate with the mandrel still attached thereto and chemically vapor depositing a ceramic material to the backstructure to enclose the backstructure and reinforce the bonding thereof to the faceplate; and
  (c) after separating the mandrel from the faceplate and backstructure, chemically vapor depositing an optical grade ceramic material onto the then exposed or front surface of the faceplate thereby to complete the fabrication of the mirror.

In accomplishing these and other objectives of the invention, there is provided a chemical vapor deposition process to fabricate ceramic mirrors, and in particular, lightweight Si/SiC mirrors. The process involves three chemical vapor deposition steps: a first step involving the use of a mandrel having opposed surfaces, one of which is flat with the figure of the other surface being preshaped in a desired configuration, to produce the mirror faceplate; a second step to form a lightweight backstructure which is deposited integrally to the exposed surface of the faceplate thereby to form a monolithic structure; and a third step for depositing a layer of optical grade material, preferably Si, onto the opposite but then exposed or front surface of the faceplate. The mirror figure and finish are fabricated into the latter material.

In a chemical vapor deposition process, atoms/molecules react on the surface of a substrate to produce a solid. Consequently, replication down to an atomic scale is possible. In order to obtain good replication, two important issues must be resolved. These are choice of a suitable mandrel and mandrel substrate separation. A good mandrel material must satisfy the following criteria:

(1) its coefficient of thermal expansion (CTE) should match that of the material to be deposited;

(2) it should be able to withstand high temperature, low pressure and the corrosive deposition environment; and (3) it should be inert to the reactants, products and the material to be deposited.

Some mandrel materials that have been used to deposit SiC are graphite, molybdenum (Mo), tungsten (W), sapphire and SiC. The Mo and W mandrels become etched initially due to the presence of chlorine compounds which are often used as reagents in SiC deposition. However, once a thin layer of SiC is deposited, etching stops and these materials work quite well as mandrel materials. The SiC deposition on highly polished pieces of sapphire and SiC yields a high degree of replication. However, a SiC mandrel requires a suitable coating to effect mold release. A high density graphite mandrel provides a near-net shape replication, i.e., within 100 μm of the desired figure.

In order to obtain a clean mandrel/substrate release, i.e., separation of the SiC deposit from the mandrel, the following conditions must be satisfied:

(1) the SiC deposit should not stick to the mandrel; and (2) the deposition should occur selectively on the required surface.

The first issue is typically resolved by using either a highly polished mandrel (sapphire), or applying a coating of a suitable material such as amorphous carbon onto graphite, Mo, W, and SiC mandrels. Concerning the selectivity of the deposition, it should be ensured that the deposition should not occur on the edges and the backside of the mandrel. Since it is difficult to precisely match the CTE of the mandrel and the deposit over the whole operating temperature range, deposition on the backside of the mandrel invariably produces stress during cool down. These stresses cause cracks or distortion in the material and/or the mandrel. To decouple the SiC deposit from the graphite mandrel, as disclosed in the pending application bearing Ser. No. 07/403,957, filed Sept. 7, 1989 now U.S. Pat. No. 4,963,393 by J. S. Goela, R. D. Jaworski and R. L. Taylor (Case 1833-33-00), the disclosure of which application, by reference, is incorporated herein, a soft flexible graphite gasket around the periphery of the graphite mandrel may be used. This gasket acts as a buffer between the SiC and graphite, allowing a slight movement of the SiC relative to the graphite during cool down.

The SiC lightweight backup structure is obtained by first fabricating a graphite "egg crate" core from graphite ribs about 0.020 inch (0.5 mm) thick, as disclosed in the pending application for patent bearing Ser. No. 389,248, now abandoned filed on Aug. 3, 1989 by J. S. Goela and R. L. Taylor, the joint applicants herein, and by M. A. Pickering, the disclosure of which application, by reference, is incorporated herein. This core, in its basic form, consists of a hexagonal cell with six inner triangular cells. There are flow holes in the walls of the structure. They reduce the structural weight, provide passages for the dispersal of reagents thereby providing a more uniform deposition, and connect the SiC deposit on both sides of the walls, thus acting as rivets and making the structure stronger and more rigid. This light-weighted structure is placed on the backside of the SiC facesheet or faceplate and then coated with SiC. However, prior to SiC coating, the backside of the SiC faceplate is appropriately treated to ensure that the subsequent SiC deposit will bond strongly to the SiC faceplate. This process produces a monolithic light-weighted SiC structure without the use of any bonding agents.

Investigation of different backstructure cell geometries such as square, hexagonal and triangular and cell aspect ratios (cell height to inscribed circle diameter) ranging from 0.25 to 3.5 has shown that good cell to cell uniformity is obtained when the following conditions are satisfied:

(1) the CVD gas flow impinges upon the backstructure; and (2) the flow holes are near the bottom of the backstructure.

Another consequence of CVD deposition is that the walls of the backstructure are tapered with the thinnest SiC coating near the faceplate. This is beneficial for the structure since, for the same weight, it increases structure stiffness. However, a minimum SiC coating is still required at all places in the structure. It has been found that the cell aspect ratio should not exceed 1.5, to obtain acceptable light-weighted structures.

A silicon coating on the near-net shape SiC faceplate is applied to permit fabrication of the final optical figure. Optical fabrication of Si is a known technology, and a figure of 1/10th of a wave and a finish less than 10 Å RMS are readily achievable. Chemically vapor deposited Si bonds quite well to chemically vapor deposited SiC. Chemically vapor deposited Si has been successfully deposited on polished, lapped and dirty SiC samples (surfaces on which 1-2 coats of carbon spray had been applied), indicating that the SiC surface preparation is relatively unimportant to obtain a strong Si-SiC bond. Further, the Si coating does not crack, delaminate or spall when the Si-SiC two layer material is subjected to stresses associated with the optical fabrication, thermal cycling in the temperature range of −140° C. to 1000° C. and four point bend tests. These results indicate that Si-SiC bond is quite strong and perhaps chemical in nature.

The thickness of the Si coating on the SiC faceplate normally ranges from a few microns in the case of flat faceplates to hundreds of microns in the case of curved faceplates. In-situ treatment of the replicated surfaces is performed before a Si coating is applied. Since the Si coating is required only on the front surface of the mirror, all other areas are masked with flexible graphite. The SiC faceplate is mounted such that the flow directly impinges onto the replicated surface. This configuration provides a more uniform Si coating.

In the first step of the chemical vapor deposition process, a substrate or mandrel is fabricated from graphite or any other suitable material such as SiC, molybdenum (Mo), tungsten (W), or sapphire. A surface, which is a "negative" of the actual mirror figure desired, is fabricated on one side of the mandrel. The mandrel is polished to a high degree of tolerance, and when made of graphite, SiC, Mo or W, is coated with a mold release coating such as a suspension of colloidal graphite. After such polishing and coating, if needed, the mandrel is suitably mounted in a chemical vapor deposition reactor. In the reactor the mandrel is heated to a temperature of about 1300° C. and a mixture of methyltrichlorosilane ($CH_3SiCl_3$, hereinafter referred to as MTS) and hydrogen ($H_2$), in the ratio of 1:4, is introduced to deposit thereon a layer of SiC of predetermined thickness. The SiC layer acts as a faceplate for the Si/SiC mirror. The faceplate has a backside, that on the deposition side, which is exposed, and a front side which adjoins the surface of the mandrel on which the faceplate is formed.

The mandrel and the attached SiC faceplate are then removed from the reactor and the deposition side thereof is cleaned without removing the faceplate from the mandrel. The mandrel provides proper support for the SiC faceplate during the cleaning operation, such support being desirable because the faceplate is usually thin as compared to the surface area thereof.

A hexagonal cell, honeycomb core, back structure, as disclosed in the aforementioned application for patent bearing Ser. No. 389,248, which has been fabricated from graphite ribs of thickness about 0.5 mm., is then bonded to the backside of the faceplate, that is, the side remote from the mandrel.

In the second step of the chemical vapor deposition process, the assembly, consisting of the graphite mandrel, the SiC faceplate, and the graphite lightweight core, is then mounted in the chemical vapor deposition reactor and a layer of SiC is deposited onto the graphite core structure. This deposition totally encloses the graphite core structure and also reinforces the bonding thereof to the SiC faceplate.

After unloading the assembly from the chemical vapor deposition reactor, the mandrel is separated from the SiC faceplate, yielding a replicated figure of the mandrel surface on the faceplate. This replicated figure is within 100 $\mu$m when deposited on a high density graphite mandrel and within a few microns for sapphire and SiC mandrels.

Since Si is relatively easier to polish than SiC, a coating of Si is applied to the mirror faceplate. The Si coating on SiC is particularly desirable when graphite is used in a mandrel material.

In order to apply the Si coating, the replicated SiC faceplate and attached SiC coated graphite core structure are mounted in the reactor in a third step of the chemical vapor deposition process. The reactor is heated to about 1000° C., and a mixture of trichlorosilane ($SiHCl_3$, hereinafter referred to as TS) and $H_2$, in the ratio of 1:5, is passed through the deposition region. After a sufficient thickness of Si is deposited, the Si/SiC mirror substrate is unloaded from the reactor. Finally, the near-net shape mirror is optically fabricated to the desired level of figure and finish.

In accordance with the invention, the chemical vapor deposition process, as herein described, may be modified to fabricate lightweight mirrors of Si and SiC/Si (faceplate of SiC and a lightweight structure of Si).

Also, as those skilled in the art will understand, the chemical vapor deposition mirror fabrication technology, according to the invention, is quite general. This technology can be employed to fabricate mirrors of other ceramic materials. By way of example and not limitation, advanced ceramic materials such as $TiB_2$ and $B_4C$ possess physical, mechanical, and optical properties comparable to those of SiC for mirror applications. Mirrors made of these materials can also be fabricated by means of the chemical vapor deposition process according to the invention. Consequently, for specific applications requiring some unique characteristics of these materials, SiC can be readily replaced with any one of these materials.

The various features of novelty which characterize the invention are pointed out with particularity in the claims annexed to and forming a part of this specification. For a better understanding of the invention, its operating advantages, and specific objects attained by its use, reference is made to the accompanying drawings and descriptive matter in which preferred embodiments of the invention are illustrated.

BRIEF DESCRIPTION OF THE DRAWINGS

With this description of the invention, a detailed description follows with reference being made to the accompanying drawings which form part of the specification, of which.

DESCRIPTION OF THE PREFERRED EMBODIMENT

Figure 1:
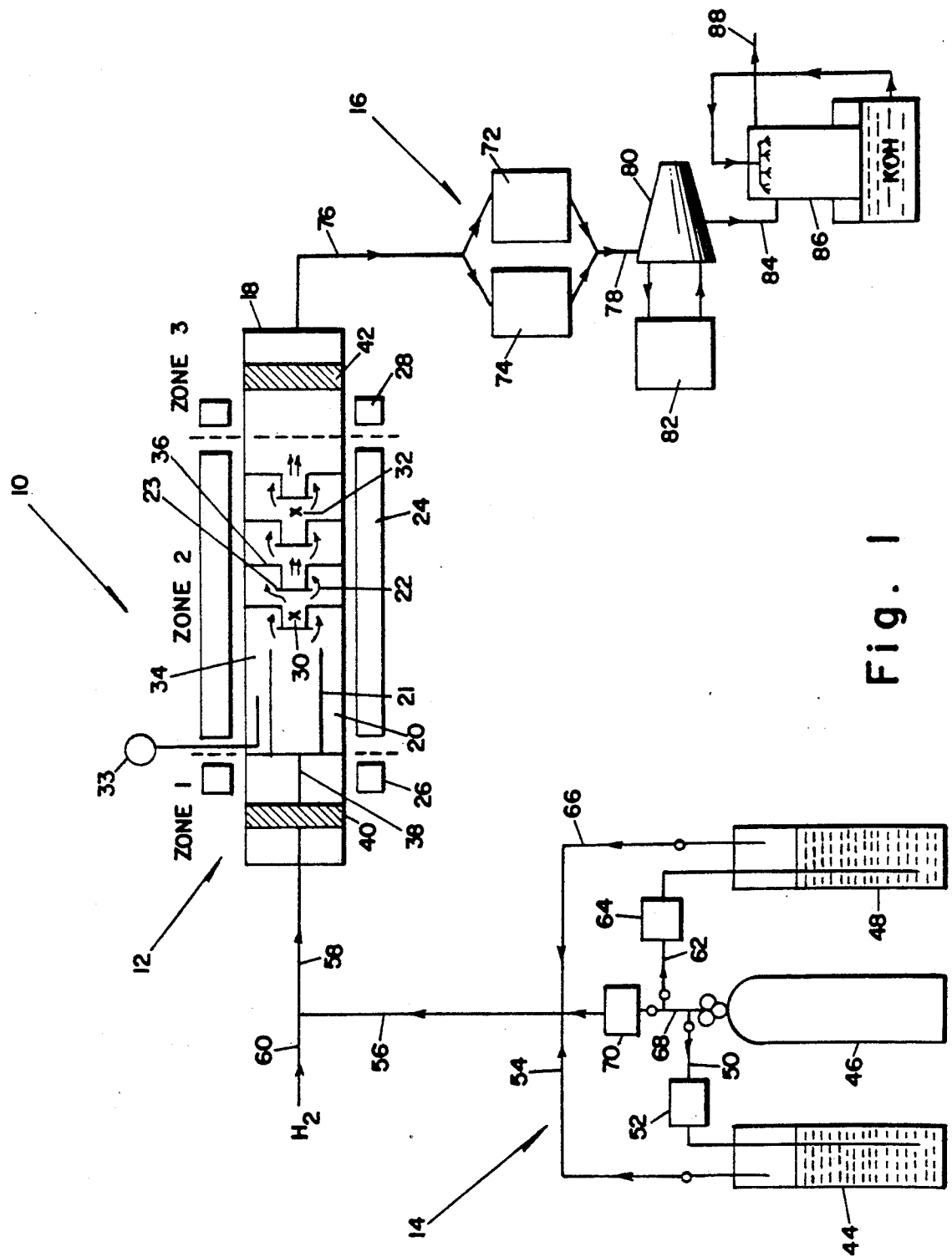
FIG. 1 is a schematic illustration of a chemical vapor deposition apparatus that may be employed in carrying out the process of the invention in the fabrication of lightweight Si/SiC mirrors.

FIG. 1 schematically illustrates a chemical vapor deposition reactor or apparatus 10 that may be used in accordance with the invention to fabricate lightweight Si/SiC mirrors. The apparatus 10 includes a 3-zone Lindberg furnace 12 having a maximum temperature capability of 1500° C. The apparatus 10 further includes a reactant supply system 14 and an exhaust system 16.

Associated with the furnace 12 is an elongated tube 18 of aluminum oxide ($Al_2O_3$) containing a reaction or deposition chamber 20 in which one or more mandrels 22 to be replicated may be placed. In the deposition chamber 20, as shown in the drawing, provision is made for effecting the vapor deposited on simultaneously of four graphite mandrels 22. Thus, there is included in deposition chamber 20 a gaseous flow directing mandrel 21 and alternate baffle and baffle plates 23 and 36, respectively, in a series arrangement.

Tube 20 is substantially coextensive with zones 1-3 of the 3-zone furnace 12. Zone 2 is heated by an electrical heating element 24. Zones 1 and 3 comprise manifold and exhaust zones, respectively, and are heated by individually associated electrical heating elements 26 and 28. A manifold (not shown) is placed at the interface of zones 1 and 2. Thermocouples indicated at 30 and 32 provide a measure of the temperature of the mandrels 22. A pressure gauge 33 is provided to indicate the pressure within the deposition chamber 20.

While not shown in the drawing, it will be understood that a temperature controller may be provided to control the energization of the heating element 24 for controlling the temperatures of the mandrels 22. Similarly, a manifold temperature controller may be provided to control the energization of the heating element 26, and an exhaust temperature controller may be provided to control the energization of the heating element 28.

Located within the deposition chamber 20 is a deposition zone 34 in which the mandrels 22 to be replicated are placed. Each mandrel 21 consists of four sides of an open box. Also included in the deposition chamber 20 is a baffle plate indicated at 36 individual to each of the mandrels 22. An injector 38 made of stainless steel extends through the manifold into the deposition zone 34. Blocks of firebrick, designated 40 and 42, are located outside tube 18 in the regions thereof respectively associated with zones 1 and 3.

The reactant supply system 14 includes a bubbler cylinder and dip tube device 44 containing MTS (which at room temperature is a liquid), a tank 46 comprising a source of argon (Ar) under pressure, a tank (not shown) comprising a source of hydrogen (H$_2$) under pressure, and a bubbler cylinder and dip tube device 48 containing TS.

Argon flows through a flow line 50 to the bubbler cylinder and dip tube device 44. A mass flowmeter and controller 52 is connected in the flow line 50 and controls the flow of argon to the device 44. Argon bubbles carrying the reagent MTS flow through flow lines 54, 56 and 58 to injector 38 which extends through the manifold into the deposition chamber 20 of the apparatus 10. Hydrogen flows from a source (not shown) through a flow line 60 and the flow line 58 to the injector 38.

Argon also flows through a flow line 62 to the bubbler cylinder and dip tube device 48. A mass flowmeter and controller 64 is connected in the flow line 62 and controls the flow of argon to the device 48. Argon bubbles conveying the reagent TS flow through a flow line 66 and the flow lines 56 and 58 to the injector 38.

Argon, additionally, flows from tank 46 through a path including a flow line 68 and the flow lines 56 and 58 to the injector 38. This path bypasses the bubbler cylinder and dip tube devices 44 and 48. The flow therethrough is controlled by a mass flowmeter and controller 70 that is connected in the flow line 68.

The exhaust system 16 includes a pair of gaseous filters 72 and 74 that are connected by a flow line 76 to the exhaust zone of the furnace 12. A flow line 78 connects the outputs of filters 70 and 72 to a vacuum pump 80 and an associated oil filter 82. The output of the vacuum pump 80 is connected by a flow line 84 to a scrubber 86. Connected to the output of the scrubber 86 is a flow line 88 through which the scrubbed gases are vented to the atmosphere.

In the operation of the chemical vapor deposition apparatus 10, gases are introduced into the deposition chamber 20 where they react at the walls of the tube 18 or at the surface of the mandrels 22 or other substrates loaded into the chamber 20 and form a solid deposit or coating.

For the deposition of SiC on mandrels 22 loaded into the deposition chamber 20, MTS, H$_2$ and Ar are introduced into the deposition chamber 20 through the injector 38. Since MTS is a liquid at room or ambient temperature, Ar is bubbled through the MTS liquid and carries the MTS vapor above the liquid to the injector 38. Gases that are unreacted in the deposition chamber 20 are pumped out by means of a vacuum pump 80, filtered by filters 72 and 74, and cleaned in gas scrubber 86 before being vented to the atmosphere.

By means of this process, thick deposits ($\geq 0.25$ inch; 0.63 cm) of SiC can be made. Typical conditions for the deposition of SiC are:

| Mandrel or substrate temperature | 1300° C. |
|---|---|
| Deposition chamber pressure | 200 torr |
| Partial pressure of gases | |
| Ar | 68 torr |
| H$_2$ | 102 torr |
| MTS | 30 torr |

For the deposition of Si on the mandrels 22 or other substrates in the deposition chamber 20, TS, H$_2$ and Ar are introduced into the deposition chamber through the injector 38. TS, similarly to MTS, is a liquid at room temperature. Ar is bubbled through TS liquid and carries the TS vapor above the liquid to the injector 38. Again, gases that are unreacted in the deposition chamber 20 are pumped out by means of vacuum pump 80, filtered by filters 72 and 74, and cleaned in gas scrubber 86 before being vented to the atmosphere.

Typical conditions for the deposition of Si are:

| Mandrel or substrate temperature | 950–1200° C. |
|---|---|
| Deposition chamber pressure | 50–250 Torr |
| Partial pressure of gases | |
| Ar | 60 torr |
| H$_2$ | 110 torr |
| TS | 30 torr |

FIGS. 2-9 collectively comprise a flow chart of the chemical vapor deposition process of the invention for fabricating lightweight Si/SiC mirrors. These mirrors consist of a faceplate of SiC on which a coating of chemically vapor deposited Si has been applied and a lightweight backup structure of SiC.

Figure 2:
FIG. 2 is a view in cross section of a graphite mandrel having a prefigured and mold release coated surface.

As shown in FIG. 2, first a mandrel 90 is fabricated. A prefigured surface 92 is fabricated on one side of the mandrel 90. The prefigured surface is a negative of the actual mirror figure desired. The mandrel 90 is polished to a high degree of tolerance. When made of graphite, SiC, Mo or W, the mandrel 90 is coated with a mold release coating 94 such as a suspension of colloidal graphite. Such mold release coating is not needed when the mandrel 90 is made of sapphire.

Figure 3:
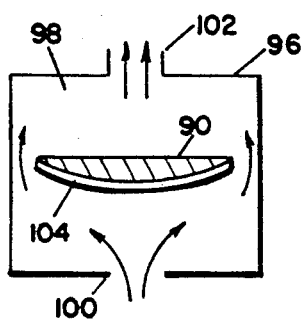
FIG. 3 is a schematic view of a chemical vapor deposition reactor chamber with the mandrel of FIG. 2 loaded therein for the deposition thereon of chemically vapor deposited SiC.
Figure 5:
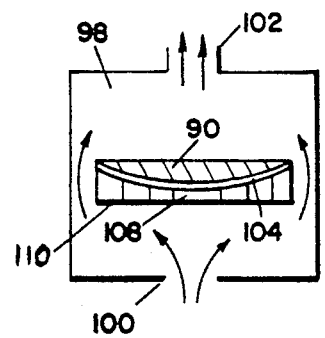
FIG. 5 is a schematic view of the chemical vapor deposition reactor chamber of FIG. 3 with the SiC coated graphite mandrel and attached lightweight graphite backstructure of FIG. 4 loaded wherein for the deposition on the backstructure of chemically vapor deposited SiC.
Figure 7:
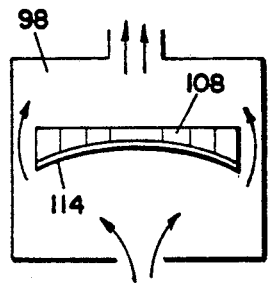
FIG. 7 is a schematic view of the chemical vapor deposition reactor chamber of FIGS. 3 and 5 with the graphite lightweight structure loaded therein for the deposition on the replicated surface of chemically vapor deposited Si.

As shown in FIG. 3, the mandrel 90 is then mounted in a chemical vapor deposition reactor 96, which, for purposes of illustration, is shown in FIG. 3, and in FIGS. 5 and 7, also, in greatly simplified form. Thus, the reactor 96 is shown as comprising a deposition chamber 98 having a size suitable to accommodate a single mandrel only and including an inlet 100 for the introduction of reagents and an outlet 102 for exhausting waste reaction products and reacted gases.

In the reaction chamber 98, the mandrel 90 is heated to about 1300° C. and a mixture of MTS and $H_2$ in the ratio of 1:4 is introduced to effect a deposit 104 of SiC of predetermined thickness on the mandrel. This SiC deposit acts as a faceplate for the Si/SiC mirror. The mandrel 90 along with the SiC faceplate 104 are then removed from the chemical vapor deposition chamber 98 and the deposition side 106 is cleaned without removing the faceplate 104 from the mandrel 90. Since the faceplate 104 is usually thin as compared to the surface area thereof, the mandrel 90 provides proper support during the cleaning operation.

Figure 4:
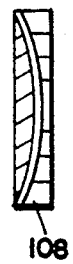
FIG. 4 is a view in cross section of the SiC coated graphite mandrel as unloaded from the chemical vapor deposition chamber of FIG. 3 but with a lightweight graphite backstructure having subsequently been mounted thereon.

A hexagonal cell, honeycomb core, backstructure 108, which has been fabricated from graphite ribs of thickness about 0.5 mm., is then mounted on and bonded to the backside of the faceplate 104, as shown in FIG. 4.

The assembly consisting of the mandrel 90, the SiC faceplate 104, and the lightweight core backstructure 108 are then mounted in the deposition chamber 98 of the reactor 96 and a layer 110 of SiC is deposited onto the backstructure, as shown in FIG. 5. This layer 110 totally encloses the lightweight graphite core backstructure 108 and also reinforces the bonding of the backstructure 108 to the SiC faceplate 104.

Figure 6:
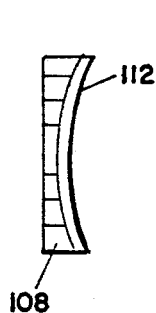
FIG. 6 is a cross sectional view of the SiC enclosed graphite lightweight structure, as unloaded from the chemical vapor deposition chamber of FIG. 5 but with the graphite mandrel having been separated therefrom, yielding thereon a replicated SiC surface.

Next, the mandrel 90 is separated from the SiC faceplate 104, yielding, as shown in FIG. 6, a replicated FIG. 112 on the faceplate 104. This replicated figure is within 100 μm when deposited on high density graphite mandrels and within a few microns for sapphire and SiC mandrels.

Figure 8:
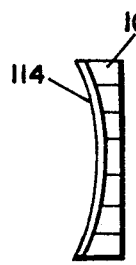
FIG. 8 is a cross sectional view of the graphite lightweight structure, as unloaded from the chemical vapor deposition chamber of FIG. 7, and showing the Si coated replicated surface.

Inasmuch as Si is relatively easier to polish than SiC, it is desirable to apply a coating of Si to the mirror faceplate 104, as shown in FIG. 7. A coating of Si on SiC is particularly desirable when graphite is used as the material for the mandrel. In order to apply the Si coating, the reactor 96, as shown in FIG. 7, is heated to a temperature of about 1000° C. and a mixture of TS and $H_2$, in the ratio of 1:5, is passed through the deposition chamber 98. After a sufficiently thick layer 114 of Si is deposited, the Si/SiC mirror faceplate 104 is unloaded from the reactor 96. The Si/SiC mirror faceplate 104, as unloaded from the reactor 96, is shown in FIG. 8.

Figure 9:
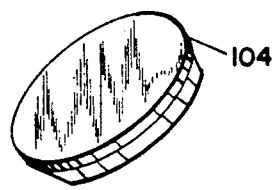
FIG. 9 is a perspective view of the finished, lightweight Si/SiC mirror and integral backstructure.

In a final step in the process, the mirror 104 is optically fabricated to the desired level of figure and finish. A perspective view of the finished mirror 104 is shown in FIG. 9.

Figure 10:
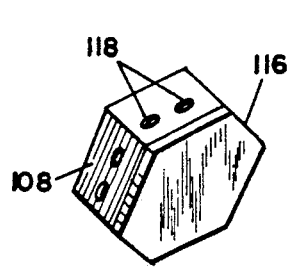
FIG. 10 is a perspective view of a flat Si/SiC mirror and integral backstructure of hexagonal outline and showing a detail of the backstructure.

The aforementioned process may also be extended to fabricate lightweight Si and SiC/Si (faceplate of SiC and lightweight structure of Si) mirrors. FIG. 10 is a perspective view of a flat Si/SiC mirror 116 of 7.5 cm. nominal diameter fabricated by the above procedure. This mirror was polished figure of better than one-fifth (1/5) of a wave 5

$$\left(\frac{\lambda}{5}\right)$$

at 0.6328 μm and a finish of ≦5 Å RMS. The flow 118 shown in the backstructure 108 in FIG. 10, and referred to hereinbefore, reduce the weight of the mirror 116, provide passages for the reagents to flow and also connect both sides of the SiC deposit. These holes 118, essentially, act as "rivets" and produce a very strong and stiff lightweight structure. Another consequence of chemical vapor deposition is that the cell walls are tapered with the thickest SiC coating away from the faceplate. This also is beneficial because it increases mirror stiffness without an increase in weight.

Figure 11:
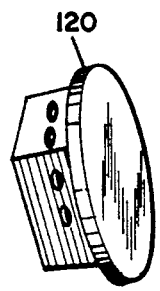
FIG. 11 is a perspective view of a flat Si mirror and integral backstructure.
Figure 12:
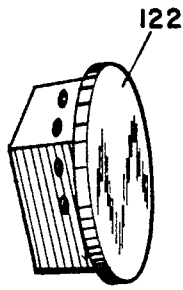
FIG. 12 is a perspective view of a curved Si/SiC mirror and integral backstructure.

FIGS. 11 and 12 are perspective views, respectively, of a flat Si mirror 120 and a curved Si/SiC mirror 122. The mirror of FIG. 11 was fabricated by the above procedure and polished to a figure of λ/5 at 0.6328 μm and a finish of ≦5 Å RMS. The curved mirror 122 has a radius of curvature of 17.5 cm with the thickness of the faceplate being in the range of 1.5–5.0 mm.

The chemical vapor deposition process described herein is quite general. Thus, mirrors of materials other than Si and SiC can also be fabricated by use thereof. Advanced ceramic materials such as $TiB_2$ and $B_4C$ possess physical, mechanical, and optical properties comparable to SiC for mirror applications. These materials can also be fabricated by means of a chemical vapor deposition process. Reference is made in this connection to the article in the Journal of the Electrochemical Society, volume 132, page 2274 (1985) by A. J. Caputo, M. J. Lackey, I. G. Wright and P. Angelini, and also to the article in the Ceramic Bulletin, volume 63, page 1160 (1984) by K. Nihara. Consequently, for specific applications requiring unique characteristics of these materials, SiC can be replaced readily with any of such materials.

As those skilled in the art will understand, the chemical vapor deposition process may be scaled up in size to yield ceramic mirrors in the 1.0 m diameter and larger size range. There is no physical limitation on the scalability of the chemical vapor deposition process except that a large size mirror requires a corresponding large size chemical vapor deposition chamber.

In a single chemical vapor deposition reactor, a plurality of mandrels can be mounted in series, as indicated in FIG. 1. This enables the fabrication of a plurality of mirrors or other substrates simultaneously. Based upon the chemical vapor deposition process described herein, three chemical vapor depositions are required fully to fabricate these lightweight mirror substrates. Ideally, these three chemical vapor depositions can be completed in about six weeks time thereby yielding several mirrors in a few weeks time from one chemical vapor deposition reactor. This time scale is relatively independent of the mirror size since a large size mirror will require a corresponding large size chemical vapor deposition reactor. With the use of additional chemical vapor deposition reactors, the production rate of these mirrors can be further increased. This is in contrast to the fabrication of glass mirrors which take several months to a few years to fabricate.

Thus, in accordance with the invention, there has been provided a chemical vapor deposition process for the rapid fabrication of lightweight ceramic mirrors, and in particular, mirrors having a faceplate of either Si or Si coated SiC and a lightweight backstructure of either Si or SiC. The process involves three chemical vapor deposition steps: one to produce the mirror faceplate, the second to form the lightweight backstructure which is deposited integral to the faceplate, and the third and final step which effects the deposition of a layer of optical grade material, e.g., Si, onto the front surface of the faceplate. The mirror figure and finish are fabricated into this latter material.

With this description of the invention in detail, those skilled in the art will appreciate that modifications may be made to the invention without departing from the spirit thereof. Therefore, it is not intended that the scope of the invention be limited to the specific embodiments illustrated and described. Rather, it is intended that the scope of the invention be determined by the appended claims and their equivalents.

What is claimed is:

1. A process to fabricate a lightweight ceramic mirror comprising the steps of:
   (a) forming on a mandrel a surface that is a negative of the actual figure that is desired for the mirror being fabricated, and chemically vapor depositing a layer of ceramic material on said surface thereby to form a faceplate of the mirror, said faceplate having a backside that is exposed and a front side that adjoins the said surface of the mandrel;
   (b) forming and bonding a lightweight backstructure to the exposed backside of the faceplate with the mandrel still attached thereto and chemically vapor depositing a ceramic material to the backstructure to enclose the backstructure and reinforce the bonding thereof to the faceplate, and
   (c) after separating the mandrel from the faceplate and backstructure, chemically vapor depositing an optical grade ceramic material onto the then exposed front side of the faceplate thereby to complete the fabrication of the mirror.

2. A process as defined by claim 1 wherein in step (a) the mandrel is made of a material having a coefficient of thermal expansion substantially matching that of the ceramic material being chemically vapor deposited thereon, and is characterized by its ability to withstand the high temperature, low pressure and corrosive deposition environment encountered in chemical vapor deposition.

3. A process as defined by claim 2 wherein the mandrel is made of sapphire with the said surface that is formed thereon in step (a) and which is a negative for the actual surface desired for the mirror being highly polished.

4. A process as defined by claim 3 wherein, in step (a), the ceramic material deposited on the said surface of the mandrel is silicon carbide,
   wherein, in step (b), the ceramic material deposited on the backstructure is silicon carbide, and
   wherein, in step (c), the optical grade ceramic material deposited on the front surface of the faceplate is silicon.

5. A process as defined by claim 3 wherein, in step (a), the ceramic material deposited on the mandrel is silicon carbide,
   wherein, in step (b), the ceramic material deposited on the backstructure is silicon, and
   wherein, in step (c), the optical grade material deposited on the front surface of the faceplate is silicon.

6. A process as defined by claim 2 wherein, in step (a), a mold release is applied to the said surface that is a negative for the actual surface desired for the mirror to facilitate the separation in step (c) of the mandrel from the faceplate.

7. A process as defined by claim 6 wherein the said surface of the mandrel is highly polished, and
   wherein the mold release applied in step (a) is amorphous carbon.

8. A process as defined by claim 7 wherein, in step (a), the ceramic material deposited on the said surface of the mandrel is silicon carbide,
   wherein, in step (b), the ceramic material deposited on the backstructure is silicon carbide, and
   wherein, in step (c), the optical grade ceramic material deposited on the front surface of the faceplate is silicon.

9. A process as defined by claim 8 wherein the mandrel is made of graphite.

10. A process as defined by claim 8 wherein the mandrel is made of silicon carbide.

11. A process as defined by claim 8 wherein the mandrel is made of molybdenum.

12. A process as defined by claim 8 wherein the mandrel is made of tungsten.

13. A process as defined by claim 7 wherein, in step (a), the ceramic material deposited on the said surface of the mandrel is silicon,
   wherein, in step (b), the ceramic material deposited on the backstructure is silicon, and
   wherein in step (c) the optical grade ceramic material deposited on the front surface of the faceplate is silicon.

14. A process as defined by claim 13 wherein the mandrel is made of graphite.

15. A process as defined by claim 13 wherein the mandrel is made of silicon carbide.

16. A process as defined by claim 13 wherein the mandrel is made of molybdenum.

17. A process as defined by claim 13 wherein the mandrel is made of tungsten.

18. A process as defined in claim 2 wherein, in step (a), the ceramic material deposited on the said surface of the mandrel is titanium diboride,
   wherein, in step (b), the ceramic material deposited on the backstructure is titanium diboride, and
   wherein, in step (c), the optical grade ceramic material deposited on the front surface of the faceplate is silicon.

19. A process as defined by claim 2 wherein, in step (a), the ceramic material deposited on the said surface of the mandrel is boron carbide,
   wherein, in step (b), the ceramic material deposited on the backstructure is boron carbide, and
   wherein, in step (c), the optical grade ceramic material deposited on the front surface of the faceplate is silicon.

20. A process to fabricate a plurality of lightweight ceramic mirrors simultaneously comprising the steps of:
   (a) forming on each of a plurality of mandrels a surface that is a negative of the actual figure desired for the mirror that is being fabricated, placing each of said mandrels in the same chemical vapor deposition chamber and simultaneously chemically vapor depositing on each of said surfaces a ceramic material thereby to form a plurality of mirror faceplates, each of said faceplates having a backside that is exposed and a front side that adjoins the said surface of the mandrel,
   (b) forming a lightweight backstructure for each of said mirror faceplates and bonding it to the exposed backside thereof with the associated mandrel still attached thereto, placing each of said plurality of attached mandrel and backstructures in the same chemical vapor deposition chamber and simultaneously chemically vapor depositing a ceramic material to each of the backstructures to enclose the backstructure and reinforce the bonding thereof to the faceplate individual thereto, and (c) after separating each mandrel from the associated faceplate and backstructure, placing the plurality of attached faceplate and backstructures in the same chemical vapor deposition chamber and chemically vapor depositing an optical grade ceramic material onto the then exposed front side of each of the plurality of faceplates thereby to complete the fabrication of the plurality of mirrors.

* * * * *